United States Patent

Ujiie

[11] Patent Number: 6,078,224
[45] Date of Patent: Jun. 20, 2000

[54] FREQUENCY STANDARD GENERATOR

[75] Inventor: Hitoshi Ujiie, Aoba-ku, Japan

[73] Assignee: Advantest Corp., Tokyo, Japan

[21] Appl. No.: 09/135,781

[22] Filed: Aug. 18, 1998

[30] Foreign Application Priority Data

Aug. 18, 1997 [JP] Japan .................................. 9-221384

[51] Int. Cl.$^7$ .................................................. H03L 7/085
[52] U.S. Cl. .............................. 331/10; 331/18; 331/1 R; 375/376; 455/260; 327/159; 327/160; 327/156
[58] Field of Search .............................. 331/17, 18, 176, 331/1 R, 10; 375/376; 327/156, 159, 162; 455/260

[56] References Cited

U.S. PATENT DOCUMENTS 5,629,649  5/1997  Ujiie .......................................... 331/17

*Primary Examiner*—Arnold Kinkead
*Attorney, Agent, or Firm*—Muramatsu & Associates

[57] ABSTRACT

A frequency standard generator for generating a high accuracy reference frequency by synchronizing a high accuracy atomic frequency standard or equivalent thereof and minimizing a phase difference between the generated reference frequency and the received atomic frequency standard. The frequency standard generator includes a voltage controlled crystal oscillator (VCXO) for generating high stability output signal to be used as a standard frequency signal, a radio wave receiver which receives a radio wave and reproduces a time signal to be used as a reference for the VCXO, a time interval measuring circuit which measures a phase difference between the time signal and the output signal of the VCXO and generates data indicating the phase difference, a frequency control processor which produces control data to control the frequency of the VCXO such that the phase difference maintains a constant value through an operation of a phase lock loop, a phase controller which initiates a phase control operation for reducing the phase difference for a predetermined period of time, and a D/A converter which converts the received data to an analog voltage to be supplied to the VCXO.

13 Claims, 8 Drawing Sheets

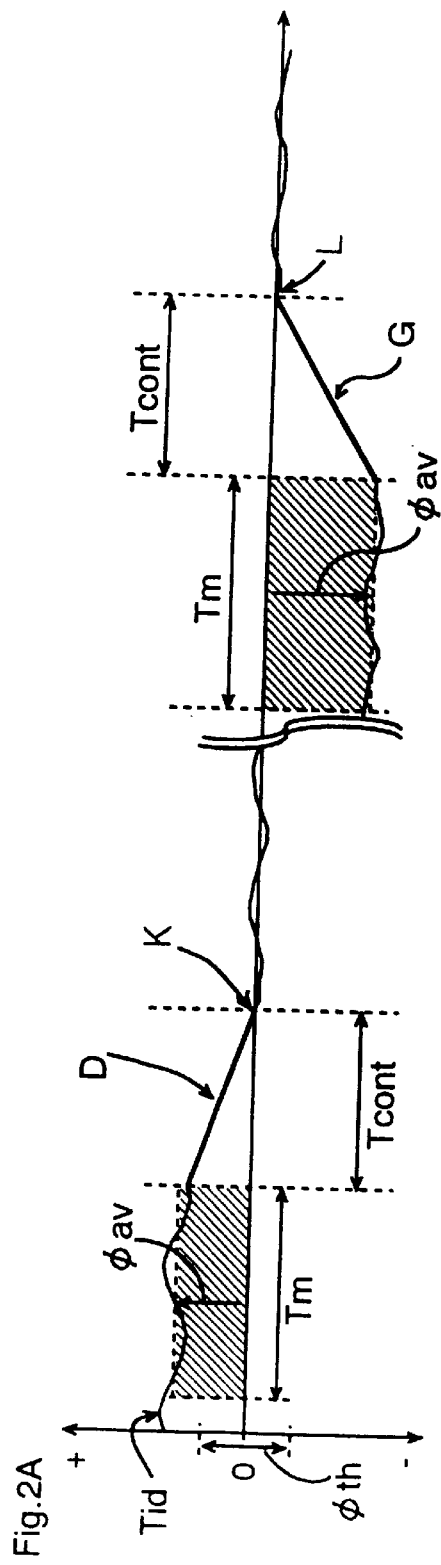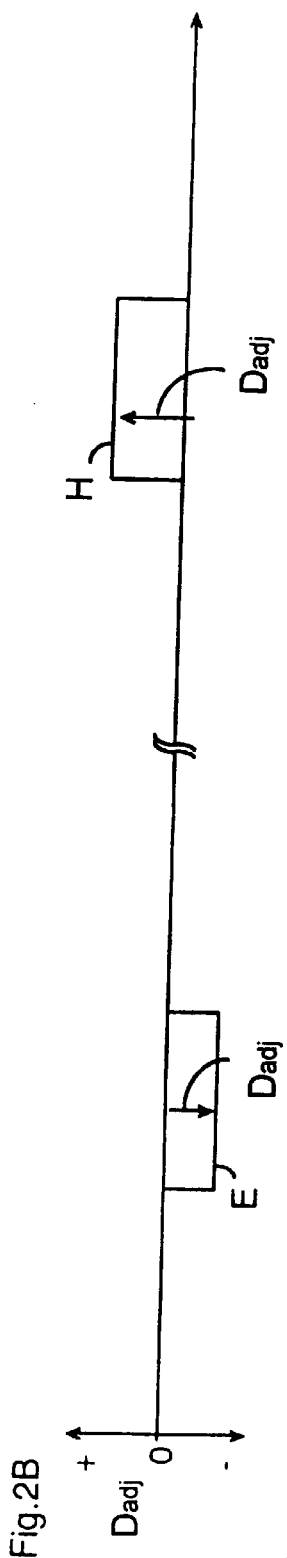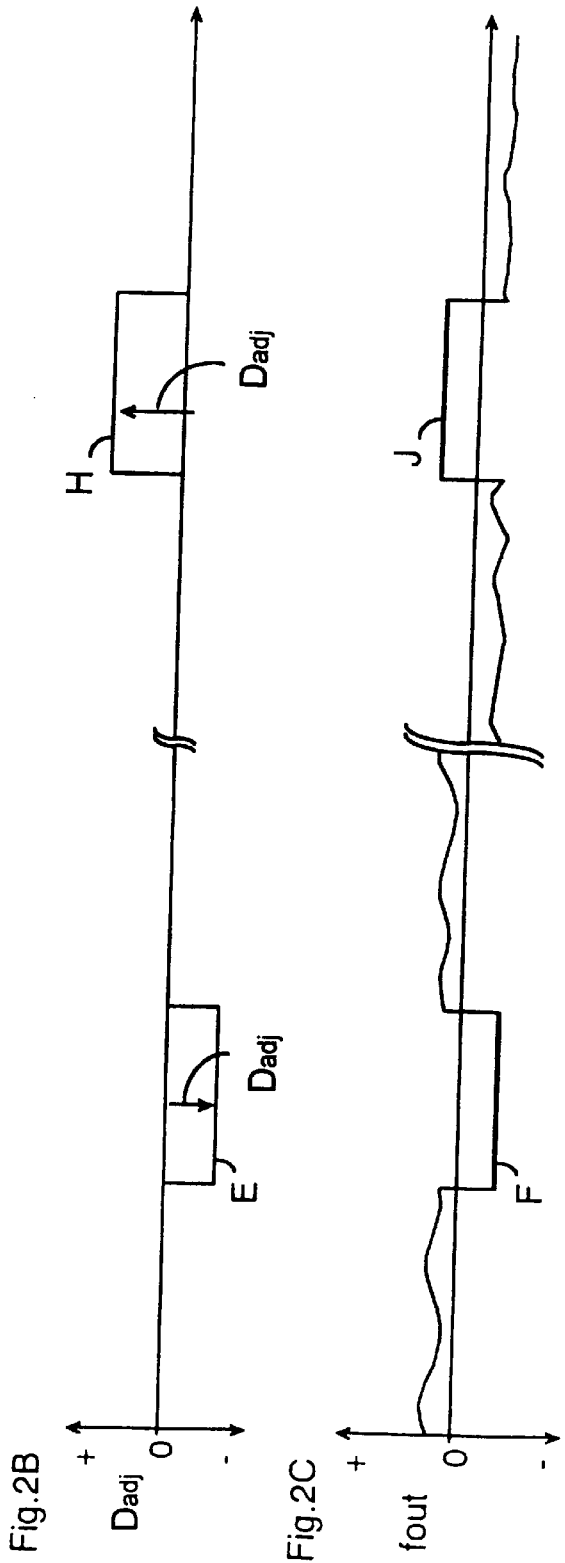

FREQUENCY STANDARD GENERATOR

FIELD OF THE INVENTION

This invention relates to a frequency standard generator for generating a high accuracy and stability reference frequency, and more particularly, to a frequency standard generator for generating a high accuracy reference frequency by synchronizing a high accuracy atomic frequency standard or equivalent thereof received from a satellite or other communication systems and minimizing a phase difference between the generated reference frequency and the received atomic frequency standard.

BACKGROUND OF THE INVENTION

A recent advanced communication system, for example, requires a higher resolution and accuracy clock signal uniformly used in communication networks and systems. In particular, a digital communication network, a data communication network including mobile communication networks and TV broadcasting networks, and an environmental observation network of global scale require high resolution and stability clock signal.

An example of conventional frequency standard generator to be used for such purposes is shown in the U.S. Pat. No. 5,629,649 issued to Ujiie which is briefly shown in FIG. 6. In this conventional example, the frequency standard generator has a voltage controlled quartz-crystal oscillator which is phase locked to a GPS (Global Positioning System) satellite time signal. The standard generator receives the radio waves from the GPS satellite to reproduce a high accuracy time signal in the radio waves. The time signal in the radio wave is originated by an ultra-high accuracy atomic frequency standard installed in the GPS satellite. The frequency standard generator of FIG. 6 synchronizes the quartz-crystal oscillator with the time signal on the basis of average phase data indicating a phase difference of a long time period between the GPS time signal and the reference clock time of the quartz-crystal oscillator by means of a phase lock loop.

The conventional frequency standard generator of FIG. 6 includes a voltage controlled crystal oscillator (VCXO) 10, a temperature sensor 29 attached to the crystal oscillator 10, a satellite wave receiver 11, a time interval measuring circuit 12, a frequency control processor 13, a D/A (digital to analog) converter, a frequency divider 15 and a frequency converters 16 and 17. An output frequency $f_{out}$ of the frequency standard generator is used as a standard frequency signal.

The frequency standard generator of FIG. 6 forms a phase lock loop wherein the output frequency of the voltage controlled crystal oscillator 10 is phase locked to the GPS time signal from the GPS satellite. To accomplish the phase lock operation, the output frequency of the crystal oscillator 10 is fedback to be compared with the GPS time signal. A resultant comparison signal forms a control signal to control the phase of the crystal oscillator output to be equal to the satellite time signal. Thus, a negative feedback loop is created to form the phase lock loop noted above as described in more detail below.

More specifically, the voltage controlled crystal oscillator 10 of FIG. 1 includes a quartz-crystal oscillator which has, for example, frequency stability of $5 \times 10^{-10}$/day and a variable frequency range ($\Delta f/f$) of $2 \times 10^{-7}$. The quartz-crystal oscillator is preferably provided in a constant temperature oven. The temperature of the oven is monitored by the temperature sensor 29 to feedback control the temperature of the crystal oscillator 10 thereby minimizing the frequency change caused by the temperature change.

The satellite wave receiver 11 receives the radio wave from a GPS (Global Positioning System) satellite and reproduces a time signal in the radio wave. Typically, the time signal from the GPS satellite is a 1 pps (one pulse per second) signal which is modulated by a carrier signal of the radio wave. The time signal in the radio wave is produced by an atomic frequency standard such as a cesium or rubidium frequency standard and has a very high frequency accuracy and stability.

The time interval measuring circuit 12 measures the time interval of the satellite time signal $S_{1pps}$ from the satellite wave receiver 11 and a crystal time signal $V_{1pps}$ from the voltage controlled crystal oscillator 10 through the divider 15 to compare the phase difference between the two. Namely, the time interval measuring circuit 12 functions as a phase comparator for the phase lock loop. Preferably, the time interval measuring circuit 12 measures the time interval (phase difference) with higher resolution than the smallest time period of a clock signal used in the circuit by incorporating an interpolation technique (not shown) as is well known in the art.

The frequency control processor 13 receives phase comparison (difference) data from the time interval measuring circuit 12 and produces a phase (frequency) control signal representing the phase difference. The frequency control processor 13 also produces various phase lock parameters which determines a response characteristics of the phase lock loop such as a loop gain and a loop bandwidth. The frequency control processor 13 dynamically determines the frequency control signal and the phase lock parameters based on the phase difference between the satellite time signal $S_{1pps}$ and the crystal time signal $V_{1pps}$.

The D/A converter 14 receives the frequency control signal from the frequency control processor 13 and converts the frequency control signal to an analog voltage which is supplied to the voltage controlled crystal oscillator 10. The output of the crystal oscillator 10 is fedback to the time interval measuring circuit 12 through the divider 15. The dividing ratio of the divider 15 is determined so as to produce a 1 pps pulse rate from the output of crystal oscillator 10 to be supplied to the time interval measuring circuit 12.

In this example, the output of the crystal oscillator 10 is also used as a clock signal for the time interval measuring circuit 12 through the frequency converter 16 which is typically a frequency multiplier to form a clock signal whose frequency is high enough to obtain a required level of resolution in measuring the time interval by the time interval measuring circuit 12.

In the frequency control processor 13, a frequency control algorithm is so established that the phase lock loop is not influenced by interference signals accidentally or intentionally applied to the radio wave. Such interference signals may last for several hundred seconds. Thus, the frequency control algorithm by the frequency control processor 13 includes a digital filter having a very long time constant such as one thousand seconds so that the phase lock loop response is not affected by the interference signals.

In this conventional technology, however, there arises a case in which phase difference data $T_{id}$ of FIG. 6 indicating the phase difference between the generated standard frequency through the divider 15 and the input time signal $S_{1pps}$ received from the satellite will not converge to zero. Alternatively, it takes a very long time for the phase difference data to reach zero. This situation is cased by various factors including the interference signals noted above, changes in the environment temperature, and the like. Another reason is that the phase lock loop of FIG. 6 functions to converge the frequency difference rather than the phase difference to zero.

Some applications of a frequency standard generator such as a mobile communication system using CDMA (Code Division Multiple Access) requires the phase of a frequency standard be within a predetermined difference from that of the GPS time signal. Although the conventional frequency standard generator is capable of generating a high stability and accuracy reference frequency, it tends to be unable to reach within a desired range of phase difference relative to the phase of the GPS time signal. Alternatively, in the conventional technology, it takes too long a time, such as several hours, to decrease the phase difference within a desired range because of the large time constant associated in the phase lock loop.

SUMMARY OF THE INVENTION

Therefore, it is an object of the present invention to provide a frequency standard generator which is capable of decreasing a phase difference between an output standard frequency signal and an ultra high accuracy time signal from an external source such as a GPS (Global Positioning System).

It is another object of the present invention to provide a frequency standard generator which is capable of decreasing the phase difference between the output frequency signal and the ultra high accuracy time signal without affecting performance of other devices.

It is a further object of the present invention to provide a frequency standard generator which is capable of gradually decreasing the phase difference between the output frequency signal and the ultra high accuracy time signal within a reasonable length of time.

It is a further object of the present invention to provide a frequency standard generator which is capable of controlling an internal quartz-crystal oscillator to be synchronized with the GPS time signal in a frequency control mode and reducing the phase difference between the output frequency signal and the GPS time signal.

It is a further object of the present invention to provide a frequency standard generator which is capable of receiving various types of reference clock signal and synchronizing the frequency of the internal crystal oscillator with the reference clock signal as well as minimizing the phase difference therebetween.

The frequency standard generator of the present invention includes a voltage controlled crystal oscillator for generating high stability output signal to be used as a standard frequency signal, a satellite wave receiver which receives a radio wave from a satellite which includes a highly accurate satellite time signal and reproduces the satellite time signal to be used as a reference for the voltage controlled crystal oscillator, a frequency divider which divides the output signal of the voltage controlled crystal oscillator by a dividing ratio arranged to generate a crystal time signal which is identical in frequency to the satellite time signal, a time interval measuring circuit which measures a time interval which is a phase difference between the satellite time signal and the crystal time signal and generates a digital signal indicating the phase difference, a frequency control processor which arithmetically determines control data based on the digital signal from the time interval measuring circuit such that the phase difference maintains a constant value by a phase lock loop, and a D/A converter which converts the control data from the frequency control processor to an analog voltage which is used to control the output frequency of the voltage controlled crystal oscillator, and a phase controller which monitors a phase difference between the output frequency of the voltage controlled oscillator and the satellite time signal and initiates a phase control operation for reducing the phase difference.

The phase controller detects the phase difference and switches the system between a frequency control mode and a forced phase control mode. The frequency control mode is an ordinary mode wherein a phase lock loop is formed so that the frequency control processor produces a frequency control signal based on the phase difference data from the time interval measuring circuit. In the forced phase control mode, the phase lock loop operation is suspended while providing a fixed data from the frequency control processor to the crystal oscillator. The phase compensation data is produced by the phase controller which is added to the fixed data to be supplied to the crystal oscillator.

The present invention makes use of the high stability of the voltage control oscillator for a relatively long period of time. Thus, during the phase control mode, the frequency of the crystal oscillator remains within an acceptable range of associated devices and immediately falls into the phase lock state when the frequency control mode is resumed.

According to the present invention, the frequency standard generator is capable of generating a highly accurate reference frequency and the phase difference relative to the ultra-high accuracy time signal such as GPS time signal is minimized through the phase control process. The frequency standard generator dynamically changes parameters of a phase lock loop for determining a response characteristics of the phase lock loop depending on the degree of a phase difference and a requirement of locking time. The frequency standard generator of the present invention is capable of obtaining average phase difference data showing a long range phase difference between the GPS time and the internal crystal oscillator. The average phase difference is minimized by applying a phase compensation data to the crystal oscillator during the phase control mode.

Further, the frequency standard generator of the present invention utilizes a voltage controlled quartz-crystal oscillator which is controlled to be synchronized with the GPS time signal. Thus, unlike the frequency standard using an atomic standard oscillator, the frequency standard generator of the present invention is low cost and maintenance free.

Furthermore, the frequency standard generator which is capable of accurately synchronizing the quartz-crystal oscillator with the GPS time within a short period of time by dynamically changing phase lock parameters of the feedback loop by a mathematical process. The high frequency stability of the frequency standard generator is also supported by the capability of dynamic compensation of the temperature change surrounding the crystal oscillator.

BRIEF DESCRIPTION OF THE DRAWINGS

FIGS. 2A–2C are timing charts showing an operation of the phase control process of the present invention.

DETAILED DESCRIPTION OF THE PREFERRED EMBODIMENTS

Figure 1:
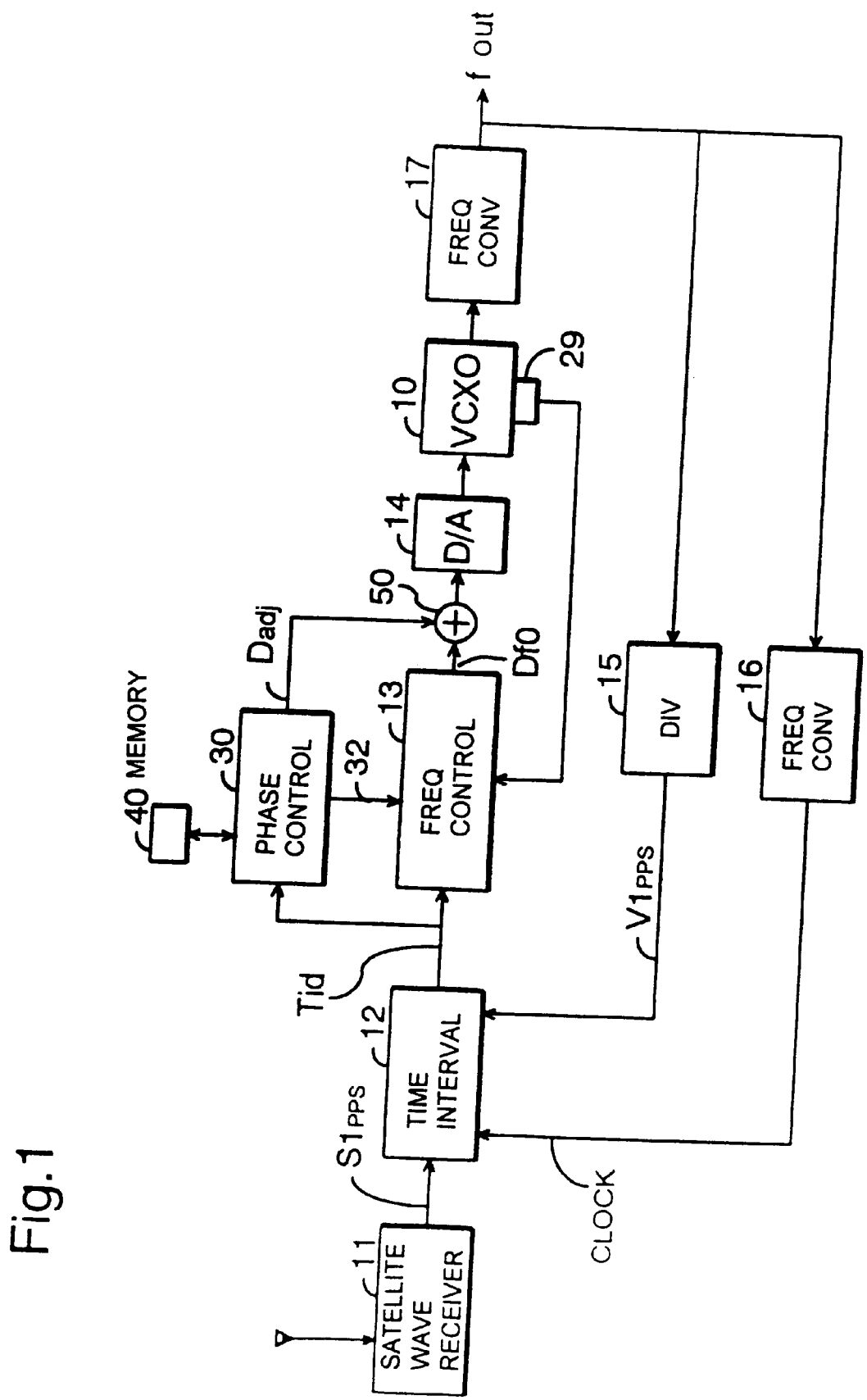
FIG. 1 is a schematic diagram showing an example of configuration of a frequency standard generator of the present invention.
Figure 8:
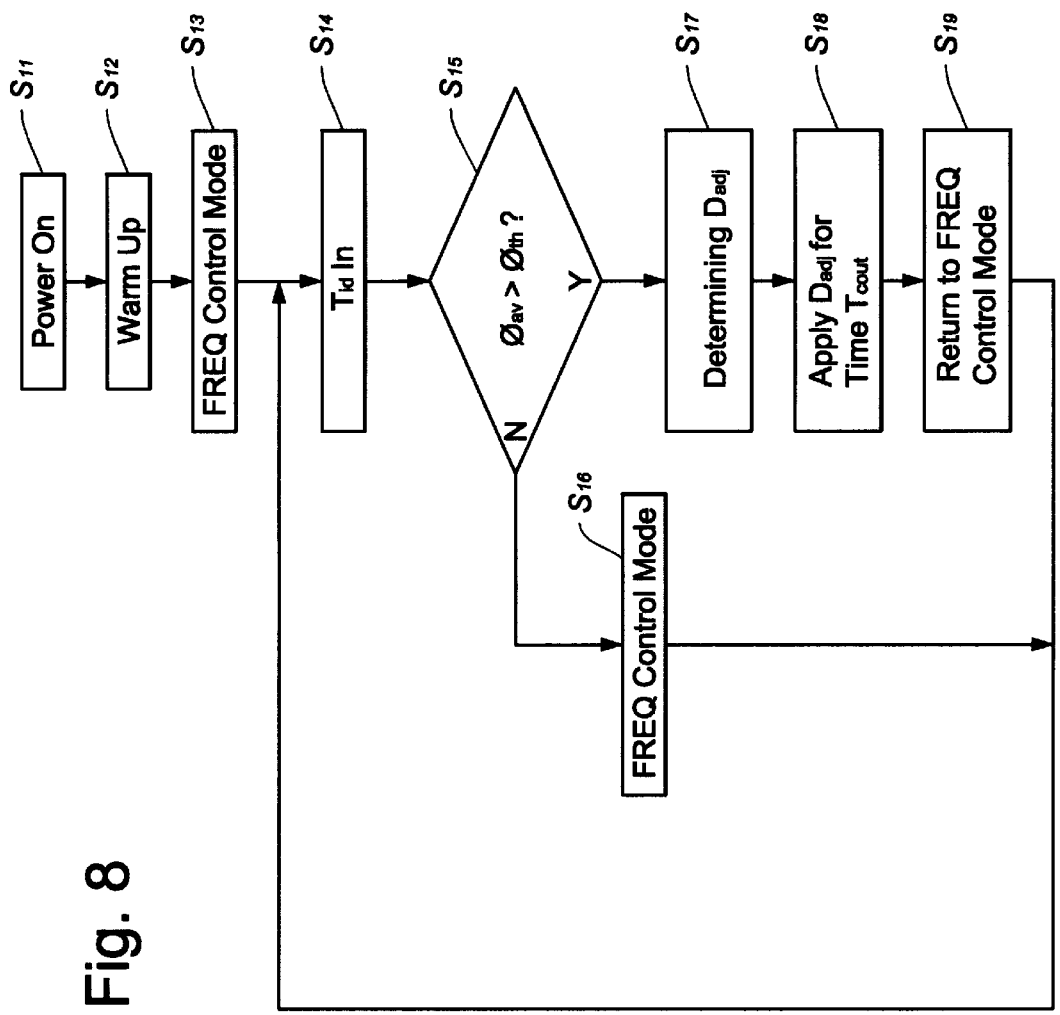
FIG. 8 is a flow chart showing an operational flow of the phase control process of the present invention.

FIG. 1 shows a schematic structure of the first embodiment of the present invention. FIGS. 2A–2C are timing charts showing the operation of the frequency standard generator of FIG. 1. FIG. 8 is a flow diagram showing the operation of the frequency standard generator of the present invention.

In FIG. 1, the frequency standard generator includes a satellite wave receiver 11 which receives a radio wave from a satellite which includes a highly accurate satellite time signal $S_{1pps}$ and reproduces the satellite time signal to be used as a reference for a voltage controlled crystal oscillator (VCXO) 10, a frequency divider 15 which divides the output signal of the VCXO 10 by a dividing ratio arranged to generate a crystal time signal $V_{1pps}$ which is almost the same in frequency as the satellite time signal. A time interval measuring circuit 12 is provided which measures a phase difference between the satellite time signal $S_{1pps}$ and the crystal time signal $V_{1pps}$ and generates a digital signal $T_{id}$ indicating the phase difference.

The frequency standard generator further includes a frequency control processor 13 which determines control data based on the digital signal $T_{id}$ from the time interval measuring circuit 12 such that the phase difference maintains a constant value by a phase lock loop. The frequency standard generator further includes a phase controller 30 for minimizing the phase difference, a phase difference memory 40 which stores the phase difference data, a data adder 50 which adds data from the phase controller 30 and the frequency control processor 13, a D/A converter which converts the control data from the data adder 50 to an analog voltage which is used to control the output frequency of the VCXO 10, and a frequency converter 17 which receives the output signal of said VCXO and converts its frequency to meet the requirement of associated devices such as used in a communication network.

Figure 6:
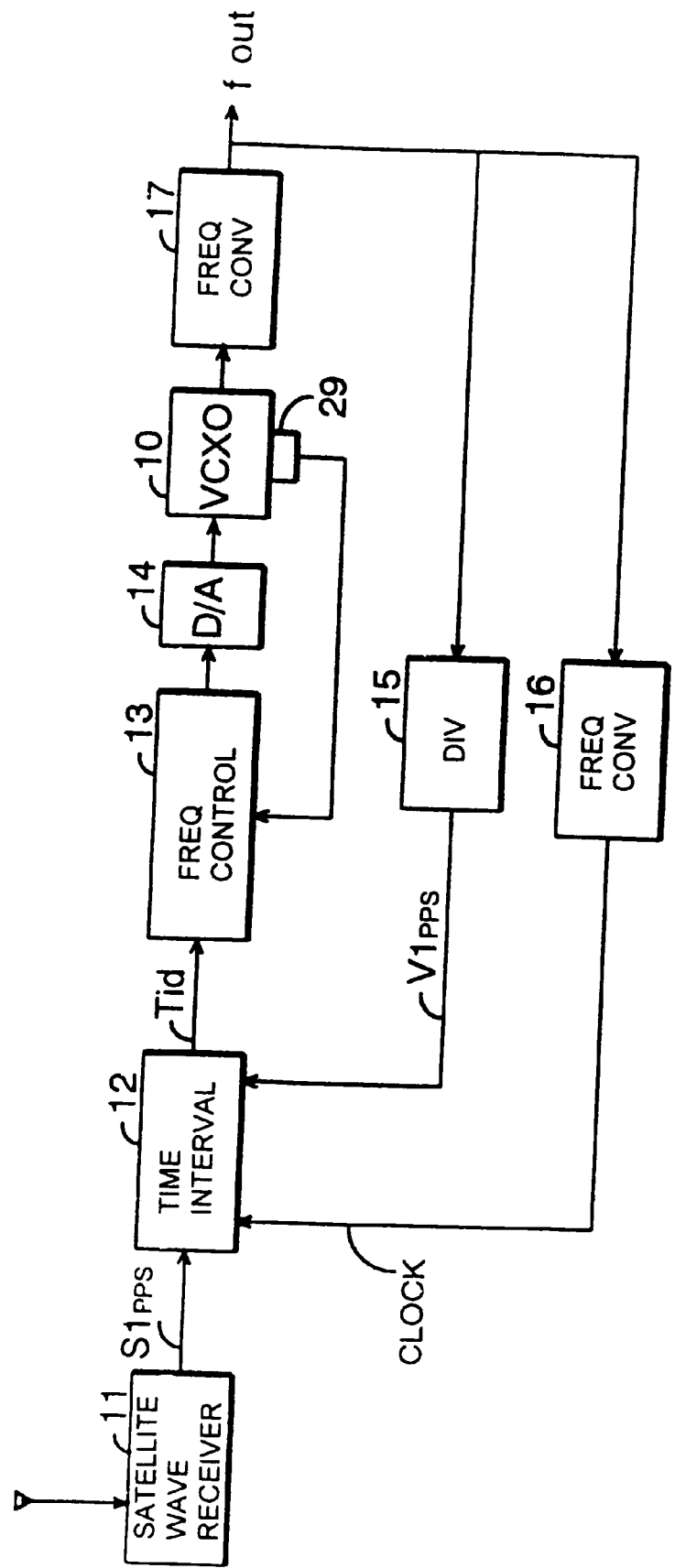
FIG. 6 is a schematic diagram showing an example of a conventional frequency standard generator.

In the same manner as described with reference to FIG. 6, a phase lock loop is configured by returning the phase difference data to the VCXO 10 to regulate the oscillation frequency thereof. In the present invention, for reducing the phase difference, the phase lock loop is temporarily set to be inoperative in a relatively short time such as several minutes or several ten minutes. This invention takes into consideration of the fact that the VCXO 10 is a highly stable oscillation source for such a short time. Thus, during this phase correction period, the frequency of the VCXO 10 is almost unchanged in the sense of practical use of associated devices such as communication devices. When returning to the normal frequency control operation, the frequency of the VCXO 10 immediately goes into the phase lock condition while the phase difference is minimized by the operation of the phase difference controller 30.

In the normal frequency control operation of the frequency standard generator of FIG. 1, the phase lock loop functions to regulate the frequency of the VCXO 10 by a large time constant of the loop. Therefore, a time interval or phase difference between the ultra high accuracy time signal $S_{1pps}$ from the satellite wave receiver 11 and the crystal time signal $V_{1pps}$ is regulated to be constant. However, as noted above, the phase difference is not necessarily regulated to zero in this kind of circuit arrangement because of other factors such as temperature changes or interferences.

In the frequency standard generator of FIG. 1, the phase controller 30 controls the VCXO 10 to change the phase in the oscillation output signal. The phase controller 30, the phase difference memory 40 which stores the phase difference data, and the data adder 50 interact to forcedly reduce the phase difference by changing the phase in the VCXO output signal. The phase difference memory 40 receives the phase difference data $T_{id}$ produced by the time constant measuring circuit 12 through the phase controller 13 and stores the difference data therein. The phase controller 30 primarily performs functions of receiving and storing the phase difference data, making a judgment whether or not a forced phase control process should be performed, and calculating an amount of phase compensation data $D_{adj}$. The data adder 50 provides a sum of the data from the frequency control processor 13 and the phase controller 30 to provide the same to the VCXO 10 through the D/A converter 14.

The value of the phase compensation data $D_{adj}$ represents a small voltage to be supplied to the VCXO 10 through the D/A converter 14 so that the phase of the VCXO oscillation signal gradually changes without changing the frequency. Because of the small voltage change, the VCXO 10 shifts its phase toward the phase equal to the time signal $S_{1pps}$ in a predetermined time length. In the preferred embodiment, such a time length for reducing the phase difference within a predetermined range is a thousand (1000) seconds.

The phase control procedure is further explained with reference to the timing charts of FIGS. 2A–2C and a flow diagram of FIG. 8. FIG. 2A shows changes in the phase difference data $T_{id}$ in the operation of the frequency standard generator. FIG. 2B shows changes in the phase compensation data $D_{adj}$ during the operation of the frequency standard generator and FIG. 2C shows changes in the output frequency $f_{out}$ during the operation of the frequency standard generator of the present invention.

The phase controller 30 monitors the degree of the phase difference and switches the system between a frequency control mode and a forced phase control mode. The frequency control mode is an ordinary mode wherein a phase lock loop is formed so that the frequency control processor 13 produces a control signal based on the phase difference data from the time interval measuring circuit 12. In the forced phase control mode, the phase lock loop operation is suspended while providing fixed data from the frequency control processor 13 to the data adder 50. The phase compensation data $D_{adj}$ is produced by the phase controller 30 which is added to the fixed data from the frequency control processor 13 by the data adder 50. The data adder 50 provides the combined data to the D/A converter 14 where it is converted to an analog signal and is fed to the VCXO 10.

Transition from the frequency control mode to the forced phase control mode is automatically initiated by the phase controller 30 when an average phase difference exceeds the predetermined threshold phase value $\phi_{th}$. A user can set values of the threshold phase value $\phi_{th}$, a time interval Tm for evaluating the phase difference, and a time length $T_{cont}$ for controlling the phase difference through a direct key input, RS232C, or GPIB.

During the frequency control mode, the phase controller 30 obtains an average phase difference $\phi_{av}$ for a predetermined relatively long time Tm as shown in FIG. 2A. For doing this, the phase difference data $T_{id}$ from the time interval measuring circuit 12 is repeatedly stored in the phase difference memory 40. When a relatively large number of phase difference data $T_{id}$, such as 1000 points of data, is obtained, the data from the phase difference memory 40 is read out. An averaging process is performed for the large number of difference data $T_{id}$ to derive an average phase difference $\phi_{av}$. The phase controller 30 determines whether the average phase difference $\phi_{av}$ exceeds the predetermined threshold phase value $\phi_{th}$. If the absolute value of the average phase difference $\phi_{av}$ is larger than the predetermined threshold value $\phi_{th}$, as in the case of FIG. 2A, the phase controller 30 proceeds to the forced phase control mode.

In the forced phase control mode, a stop signal 32 is provided to the frequency control processor 13 for suspending the frequency control operation by the phase lock loop. During this phase control mode, the frequency control processor 13 keeps supplying the fixed value $D_{f0}$ to the D/A converter 14 through the data adder 50, although the phase lock loop operation is ineffective. The fixed data $D_{f0}$ is the data produced by the frequency control processor 13 in the frequency control mode immediately before switching to the phase control mode.

The phase compensation data $D_{adj}$ is calculated based on the amount of the average phase difference $\phi_{av}$. The phase compensation data $D_{adj}$ is determined in such a way that the average phase difference $\phi_{av}$ is gradually reduced to zero during the relatively long predetermined compensation period $T_{cont}$. Thus, the phase compensation data $D_{adj}$ represents a very small voltage to be applied to the VCXO 10. The phase compensation data $D_{adj}$ as shown in FIG. 2B is added to the fixed data $D_{f0}$ from the frequency control processor 13 by the data adder 50 and is provided to the VCXO through the D/A converter 14. Thus, as shown in the phase compensation period $T_{cont}$ of FIG. 2A, the average phase difference $\phi_{av}$ is gradually and forcedly reduced to zero.

During this phase compensation period $T_{cont}$, the output frequency $f_{out}$ as shown in FIG. 2C is slightly changed because of the additional voltage derived from the phase compensation data $D_{adj}$. However, since the frequency change in the output frequency $f_{out}$ at the end of the phase compensation period $T_{cont}$ is very small, the output frequency is returned to the normal state as soon as the phase control mode is end and the phase lock loop is resumed. Further, a user can set the values of the phase threshold value $\phi_{th}$, the measurement interval Tm, and the phase compensation period $T_{cont}$ to achieve an optimum performance of the frequency control and phase control.

After the completion of the phase compensation period $T_{cont}$, which is a time period of 1000 seconds for example, the phase compensation data $D_{adj}$ provided to the data adder 50 is reset to zero. Then, the stop signal 32 to the frequency control processor 13 for suspending the frequency control operation is released to return to the normal frequency control mode. The content of the phase difference memory 40 is cleared, and another 1000 points of phase difference data $T_{id}$ are again received and stored therein. During the period of the forced phase control mode noted above, the frequency standard generator involves a phase shift in the output frequency stemming from a residue frequency difference because the VCXO 10 is in a self-running condition. However, the phase differences do not incur any actual problems because the oscillation frequency of the VCXO 10 is highly stable and the phase compensation period $T_{cont}$ is relatively short such as 1000 seconds.

The control operation of the present invention is further explained with reference to a specific example. Assuming that the phase threshold value $\phi_{th}$ is ±100 ns (nanosecond) when one time period of the time signal $S_{1pps}$ is one (1) second and the obtained average phase difference $\phi_{av}$ is +100 ns, and the predetermined phase compensation period $T_{cont}$ is 1000 seconds. Then the phase compensation data $D_{adj}$ required to cancel the phase difference $\phi_{av}$ is:

$$D_{adj}=\phi_{av}/T_{cont}=100\times10^{-9}/1000=10^{-10}$$

The phase compensation data $D_{adj}$ represents an offset voltage corresponding to $10^{-10}$ to be added to the VCXO 10. The phase compensation data $D_{adj}$ is added to the fixed data $D_{f0}$ by the data adder 50 and is converted to the analog voltage by the D/A converter 14 and is applied to the VCXO 10. Assuming that the maximum frequency variable range $f_{spn}$ of the VCXO 10 is $4.0\times10^{-7}$, and the D/A converter 14 has 16-bit resolution, an offset voltage $D_{off}$ applied to the VCXO 10 from the D/A converter 14 is:

$$D_{off}=D_{adj}/(f_{spn}/65536)=16$$

This means that an offset voltage $D_{off}$ corresponding to 16 digits (65536 full scale) of the D/A converter has to be applied to the VCXO 10 for a period of 1000 seconds. Then, the frequency standard generator returns to the normal frequency control mode where the phase lock loop is established. As a result, when the frequency control mode is resumed, the phase difference of 100 ns is canceled between the time signal $S_{1pps}$ and the crystal time signal $V_{1pps}$.

FIG. 8 is a flow diagram showing the operation of the frequency standard generator for reducing the phase difference between the ultra high stability time signal $S_{1pps}$ and the crystal time signal $V_{1pps}$ which is the output frequency $f_{out}$ whose frequency is divided by the divider 15. The frequency standard generator starts its operation by the power on step of S11. The standard generator goes into the frequency control mode in the step S13 after the warm-up period in the step S12. In the frequency control mode, the phase lock loop is formed in the frequency standard generator so that the output frequency $f_{out}$ of the VCXO 10 is regulated to be synchronized with the time signal $S_{1pps}$ from the satellite.

During the frequency control mode, the phase difference data $T_{id}$ is sampled and stored in the memory 40 in the step S14. By acquiring a plurality of phase difference data, an average phase difference data $\phi_{av}$ is calculated by the phase controller 30. In the step S15, the average phase difference $\phi_{av}$ is compared with the predetermined threshold phase data $\phi_{th}$. If the average phase difference $\phi_{av}$ is smaller than the threshold phase $\phi_{th}$, the process continues the frequency control mode in the step S16. If the average phase difference $\phi_{av}$ exceeds the threshold phase $\phi_{th}$, the process moves to the phase control mode.

In the phase control mode, the phase controller determines the phase compensation data $D_{adj}$ based on the average phase difference $\phi_{av}$ and the phase compensation period $T_{cont}$ in the step S17. The phase compensation data $D_{adj}$ is applied to the VCXO 10 via the D/A converter 14 for the time period $T_{cont}$ in the step S18. Then the process returns to the frequency control mode in the step S19.

According to the configuration of the frequency standard generator described above, the phase difference between the time signal $S_{1pps}$ and the output frequency $f_{out}$ is slowly corrected in a relatively long period of time. Because the oscillation frequency of the VCXO 10 is highly stable for such a correction period, no actual problems arise in devices using the standard output frequency $f_{out}$.

Figure 7:
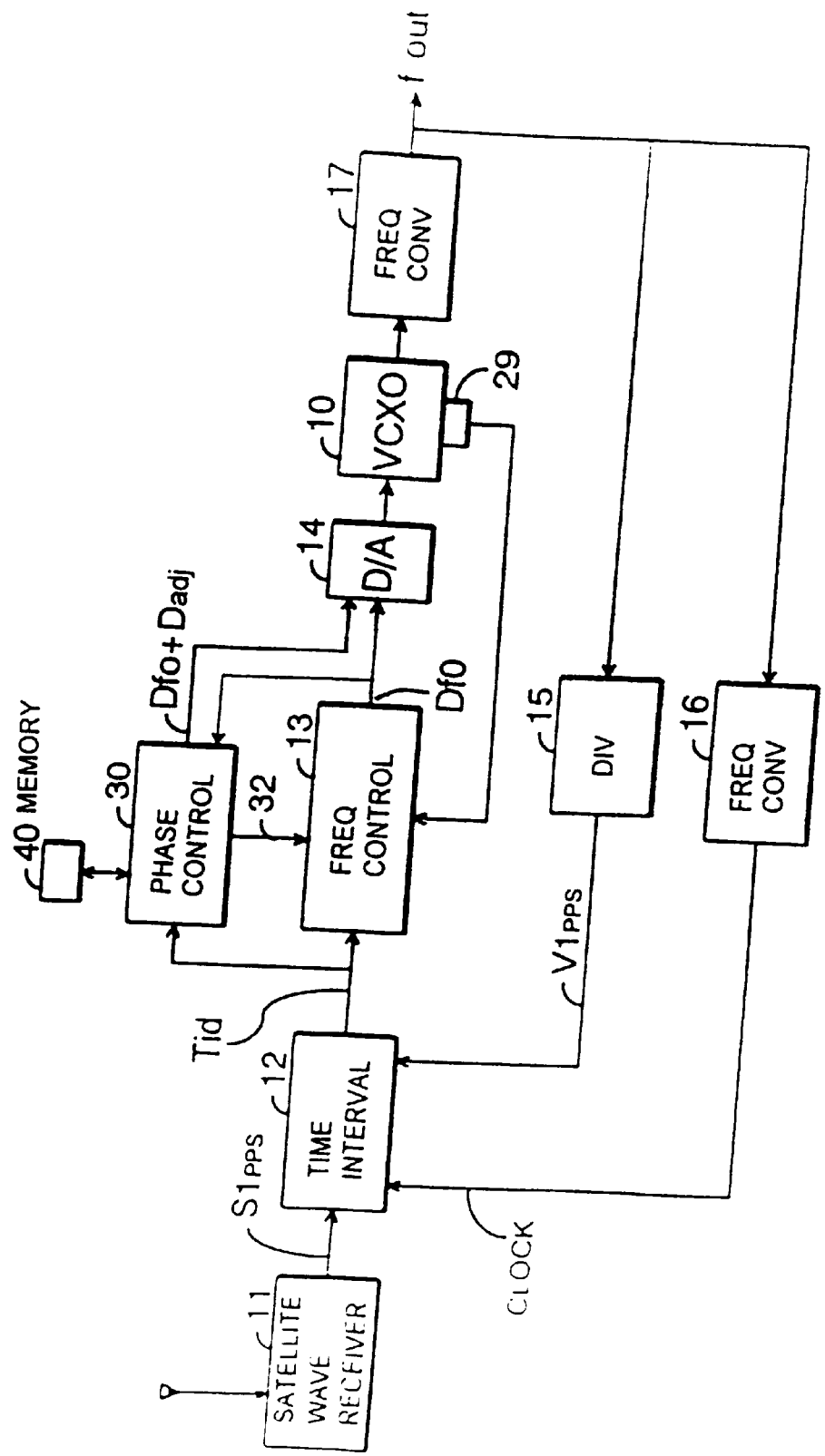
FIG. 7 is a schematic diagram showing a further embodiment of the frequency standard generator of the present invention.

In the embodiment of FIG. 1, the data adder 50 is provided to add the data from the frequency control processor 13 and the phase controller 30. However, other configuration is also possible as shown in FIG. 7. In the example of FIG. 7, the frequency control data $D_{f0}$ from the frequency control processor 13 is also provided to the phase controller 30 wherein it is added to the phase compensation data $D_{adj}$. The D/A converter 14 receives the data from the phase controller 30 which is the sum of the frequency control data $D_{f0}$ and the phase compensation data $D_{adj}$ and converts the same to an analog voltage to be supplied to the VCXO 10.

Figure 3:
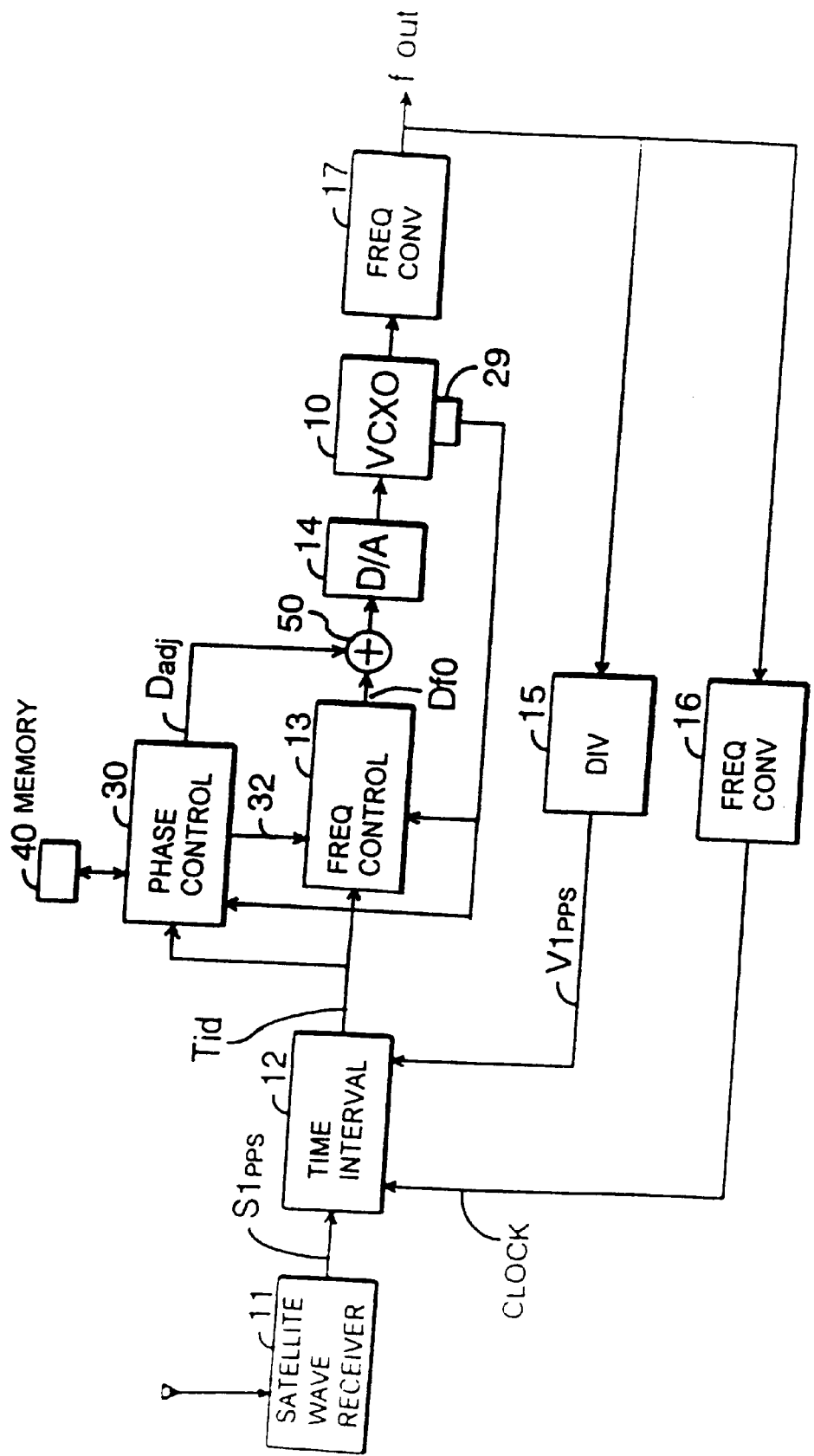
FIG. 3 is a schematic diagram showing another embodiment of the frequency standard generator of the present invention.

FIG. 3 shows another embodiment of the present invention where a temperature sense signal from the temperature sensor 29 is also provided to the phase controller 30. This example is useful when the environmental temperature changes during the period of the phase control mode. The phase controller 30 stores a temperature correction table established on the basis of the oscillation frequency versus temperature characteristics of the VCXO 10. The phase controller 30 monitors the temperature change relative to the temperature at the start of phase control mode and adjusts the phase compensation data $D_{adj}$ based on the correction factors in the stored table. Thus, the reduction of the phase difference with higher accuracy is available in this embodiment.

Figure 4:
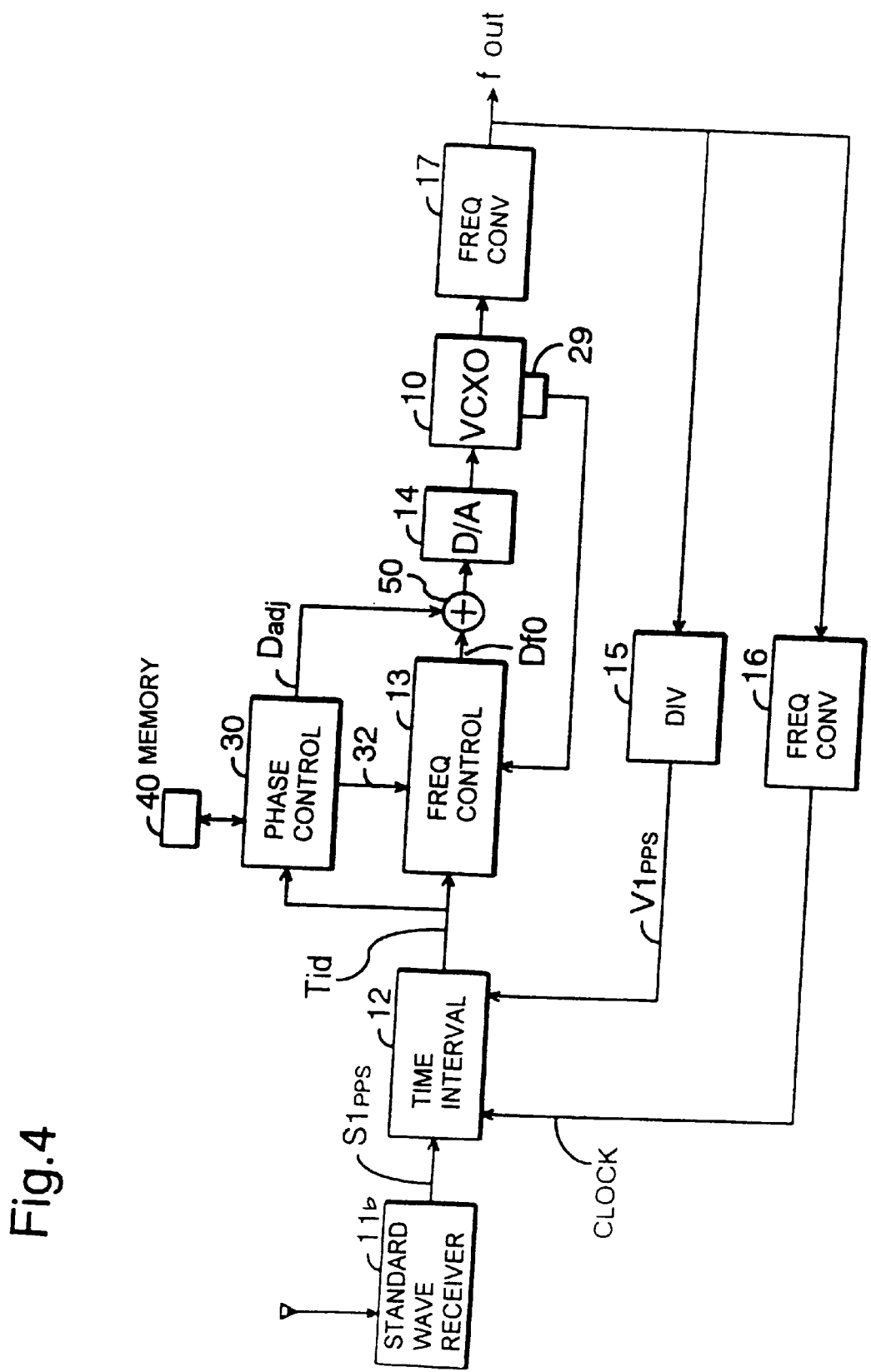
FIG. 4 is a schematic diagram showing a further embodiment of the frequency standard generator of the present invention.

In the embodiment of FIG. 1, the satellite wave receiver 11 is incorporated to receive the GPS signal from the satellite. However, instead of using the satellite wave, it is also possible to receive a national standard frequency wave through an antenna as shown in FIG. 4. Thus, in this example, the standard frequency generator produces an output frequency $f_{out}$ which is phase locked to the national standard frequency and the phase of the output frequency is adjusted to match with that of the national standard frequency.

Figure 5:
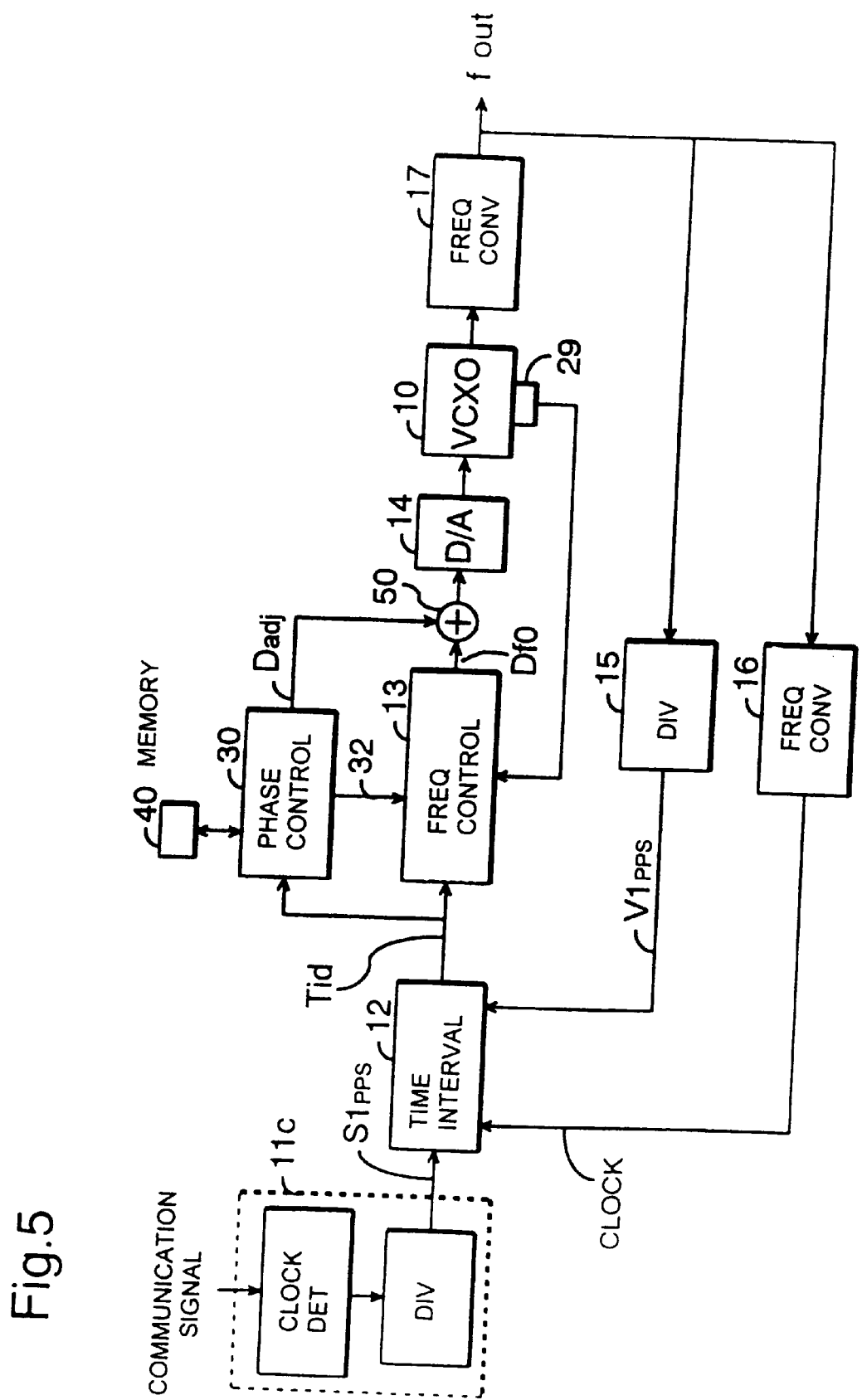
FIG. 5 is a schematic diagram showing a further embodiment of the frequency standard generator of the present invention.

Further, it is also possible to detect the high accuracy signal from the communication or broadcast networks as shown in FIG. 5. The example of FIG. 5 includes a communication and broadcast network receiver 11c instead of the satellite wave receiver 11 of FIG. 1. The receiver 11c receives communication radio wave including a standard frequency signal emitted in the communication or broadcast network. For doing this, the receiver 11c may include a clock detection circuit for detecting a standard frequency signal in the received signal and a divider to divide the standard frequency signal to lower frequency standard signal. In this case, the output frequency $f_{out}$ is phase locked to the communication or broadcast standard frequency of the communication network or broadcast network and the phase of the output frequency is adjusted to match with that of the communication or broadcast standard frequency. Moreover, since the frequency standard generator of the present invention includes a phase lock loop of a large time constant, jitter or wander in the standard frequency is removed at the output frequency $f_{out}$.

According to the present invention, the frequency standard generator is capable of generating a highly accurate reference frequency and the phase difference relative to the ultra-high accuracy time signal such as GPS time signal is minimized through the phase control process. The frequency standard generator dynamically changes parameters of a phase lock loop for determining a response characteristics of the phase lock loop depending on the degree of a phase difference and a requirement of locking time. The frequency standard generator of the present invention is capable of obtaining average phase difference data showing a long range phase difference between the GPS time and the internal crystal oscillator. The average phase difference is minimized by applying a phase compensation data to the crystal oscillator during the phase control mode.

Further, the frequency standard generator of the present invention utilizes a voltage controlled quartz-crystal oscillator which is controlled to be synchronized with the GPS time signal. Thus, unlike the frequency standard using an atomic standard oscillator, the frequency standard generator of the present invention is low cost and maintenance free.

Furthermore, the frequency standard generator which is capable of accurately synchronizing the quartz-crystal oscillator with the GPS time within a short period of time by dynamically changing phase lock parameters of the feedback loop by a mathematical process. The high frequency stability of the frequency standard generator is also supported by the capability of dynamic compensation of the temperature change surrounding the crystal oscillator.

Although only preferred embodiments are specifically illustrated and described herein, it will be appreciated that many modifications and variations of the present invention are possible in light of the above teachings and within the purview of the appended claims without departing the spirit and intended scope of the invention.

What is claimed is:

1. A frequency standard generator for generating an high accuracy reference frequency signal, comprising:

a voltage controlled crystal oscillator (VCXO) for generating high stability output signal to be used as a standard frequency signal;

a radio wave receiver which receives a radio wave which includes a high accuracy time signal and reproduces a time signal to be used as a reference for said VCXO;

a time interval measuring circuit which measures a time interval which is a phase difference between said time signal and said output signal of said VCXO and generates data indicating said phase difference ("phase difference data");

a frequency control processor which arithmetically determines control data based on said phase difference data from said time interval measuring circuit such that said phase difference maintains a constant value by a phase lock loop;

a phase controller which monitors an average phase difference between the output signal of said VCXO and said time signal and initiates a phase control operation for reducing the average phase difference for a predetermined period of time by generating phase compensation data; and a D/A converter which converts said control data from said frequency control processor or said phase compensation data from said phase controller to an analog voltage to be provided to said VCXO.

2. A frequency standard generator as defined in claim 1, further comprising a frequency divider which divides said output signal of said VCXO by a dividing ratio arranged to generate a crystal time signal which is identical in frequency to said time signal.

3. A frequency standard generator as defined in claim 1, further comprising a data adder which receives said control data from said frequency control processor and phase compensation data form said phase controller and provides a sum of said data to said D/A converter.

4. A frequency standard generator as defined in claim 1, further comprising a temperature sensor for sensing a temperature change in said VCXO and providing a temperature sense signal representing said temperature change to said frequency control processor.

5. A frequency standard generator as defined in claim 1, wherein said VCXO is provided with a temperature oven for maintaining a constant temperature in said VCXO.

6. A frequency standard generator as defined in claim 1, wherein said frequency control processor dynamically determines parameters for said phase lock loop including a loop bandwidth of said phase lock loop based on said phase difference measured by said time interval measuring circuit.

7. A frequency standard generator as defined in claim 1, further comprising a phase difference memory which stores a plurality of said phase difference data from said time interval measuring circuit, wherein said phase controller calculates said average phase difference and compares said average phase difference with a predetermined threshold phase value, and wherein said phase controller suspends a frequency control operation by said phase lock loop and initiates a phase control operation when said average phase difference exceeds said predetermined threshold phase value.

8. A frequency standard generator as defined in claim 4, wherein said phase controller stores a correction table produced based on a frequency-temperature characteristics of said VCXO and said sense signal from said temperature sensor is provided to said phase controller, and wherein said phase controller modifies said phase difference data based on said temperature sense signal and data in said correction table during a phase control operation.

9. A frequency standard generator as defined in claim 1, further includes a frequency converter which receives said output signal of said VCXO and converts its frequency to meet the requirement of a communication network.

10. A frequency standard generator as defined in claim 1 wherein said radio wave receiver is a satellite radio wave receiver which detects said time signal from said satellite radio wave produced based on an atomic frequency standard.

11. A frequency standard generator as defined in claim 10 wherein said satellite radio wave is generated by a Global Positioning System (GPS) satellite.

12. A frequency standard generator as defined in claim 1 wherein said radio wave receiver is a national frequency standard wave receiver which detects said time signal from a national frequency standard wave.

13. A frequency standard generator as defined in claim 1 wherein said radio wave receiver is a communication signal receiver which detects said time signal from said communication in a communication network or a broadcast network.

* * * * *